United States Patent
Weber et al.

(10) Patent No.: US 6,857,828 B2
(45) Date of Patent: Feb. 22, 2005

(54) INCREMENTAL STEP DRILLING SYSTEM AND METHOD

(75) Inventors: Kurt W. Weber, Corona, CA (US); Warren K. Wong, Yorba Linda, CA (US); Chunmig Yang, Harbor City, CA (US)

(73) Assignee: Excellon Automation Company, Torrance, CA (US)

( * ) Notice: Subject to any disclaimer, the term of this patent is extended or adjusted under 35 U.S.C. 154(b) by 0 days.

(21) Appl. No.: 10/041,767

(22) Filed: Jan. 7, 2002

(65) Prior Publication Data

US 2002/0168238 A1 Nov. 14, 2002

Related U.S. Application Data

(60) Provisional application No. 60/260,508, filed on Jan. 9, 2001.

(51) Int. Cl.$^7$ ................................. B23B 35/00
(52) U.S. Cl. ....................... 408/1 R; 408/17
(58) Field of Search ................. 408/1 R, 3, 17

(56) References Cited

U.S. PATENT DOCUMENTS 3,637,318 A * 1/1972 Hayes .................. 408/11
4,123,188 A * 10/1978 Deremo et al. .......... 408/17
4,604,705 A    8/1986 Imanishi
4,704,689 A * 11/1987 Asakura ................. 700/191
4,779,204 A   10/1988 Kanematsu et al.
4,872,787 A * 10/1989 Arai et al. ............... 408/1 R
4,961,675 A * 10/1990 Stewart ................... 408/1 R
5,066,171 A   11/1991 Aria et al.

FOREIGN PATENT DOCUMENTS

| DE | 199 04 117 A1 |   | 5/1999  |          |
|----|---------------|---|---------|----------|
| JP | 62-264812     | * | 11/1987 | B23B/35/00 |
| JP | 01205907      |   | 8/1989  |          |
| JP | 03111116 A    | * | 5/1991  | 408/3    |
| JP | 245908        | * | 11/1991 | 408/17   |
| JP | 280200        | * | 10/2000 | 408/17   |
| JP | 343308        | * | 12/2000 | 408/17   |

* cited by examiner

*Primary Examiner*—Daniel W. Howell
(74) *Attorney, Agent, or Firm*—Knobbe, Martens, Olson & Bear, LLP.

(57) ABSTRACT

A method for drilling a hole in a work piece, such as printed circuit boards, comprises drilling to a point in a work piece and retracting said drill bit a retract distance. The retract distance is configured such that a tip end of said drill bit remains below a top surface of said work piece. The method further comprises drilling a distance greater than said retract distance into said work piece.

37 Claims, 18 Drawing Sheets

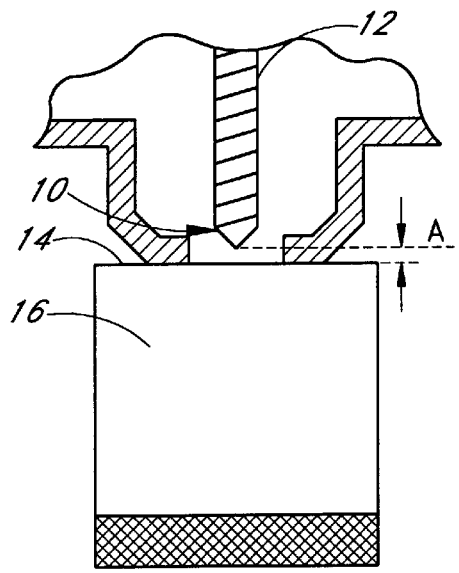
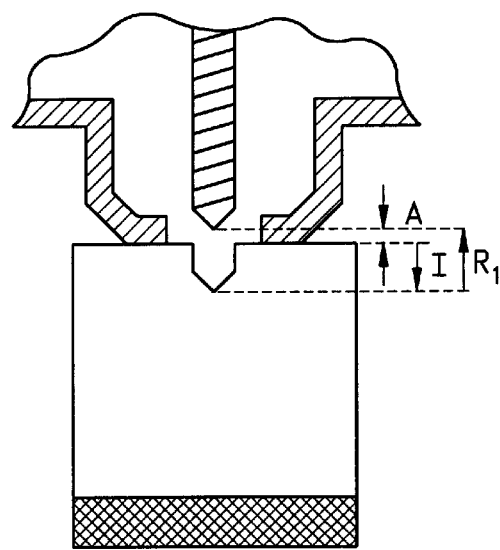
FIG. 2A    FIG. 2B
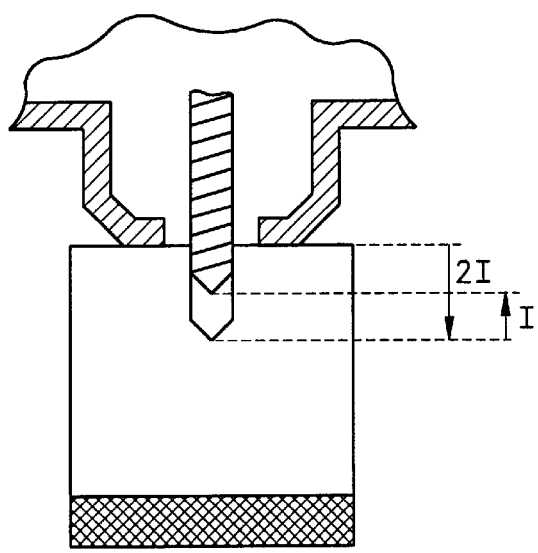
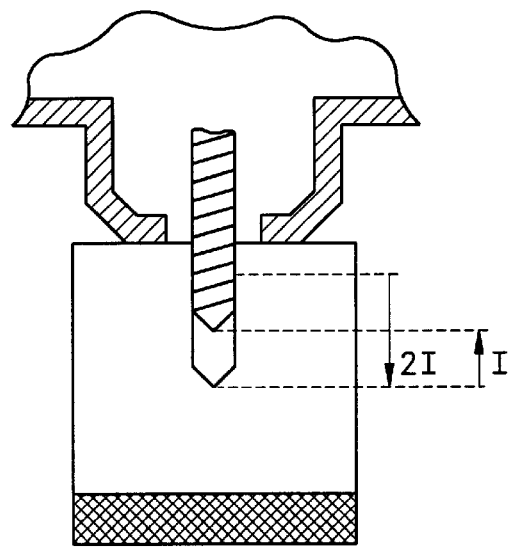
FIG. 2C    FIG. 2D

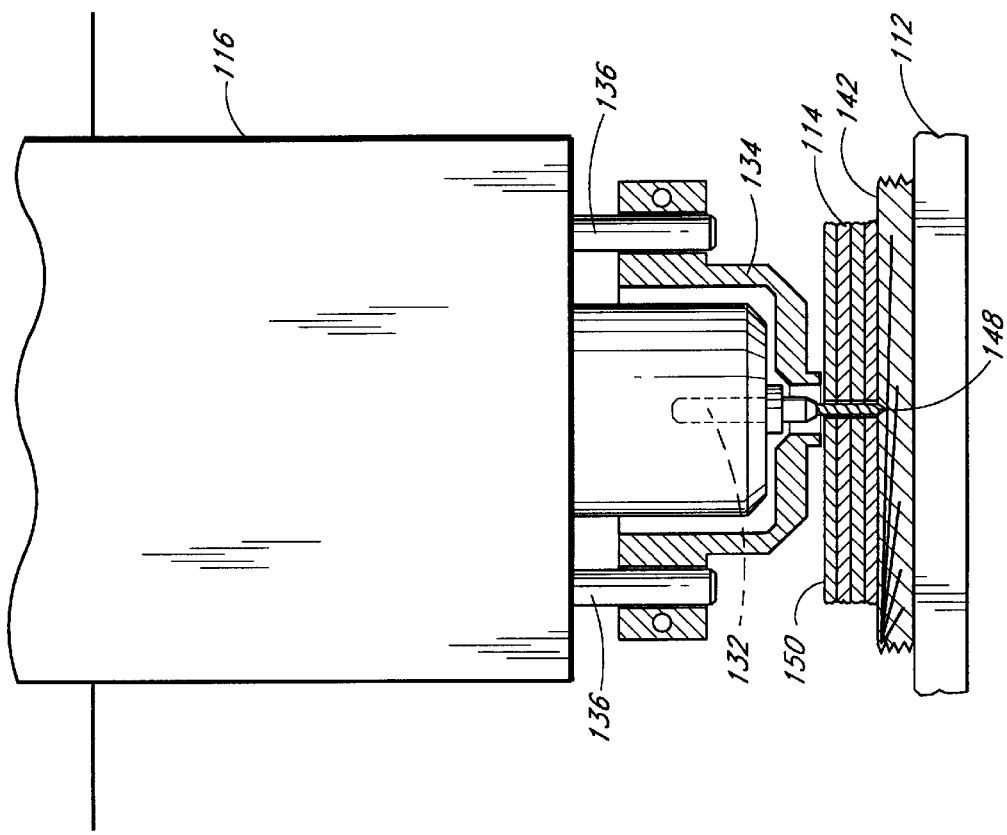
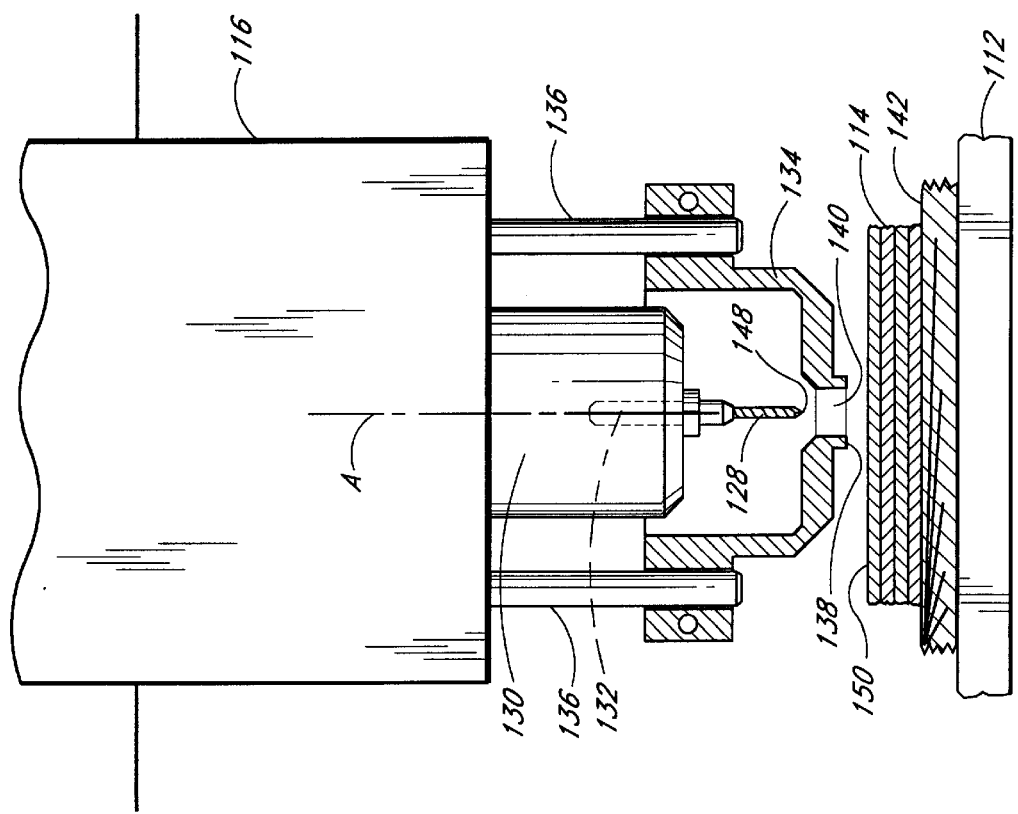

PECK DRILLING SETUP PAGE

| PECKING STATUS | PECK TOOLS | STACK HEIGHT | NO. OF PECKS | UPPER LIMIT | 2nd UP LIMIT | LOWER LIMIT | | MINIMUM STROKE |
|---|---|---|---|---|---|---|---|---|
| | | | | | | .063 | | |
| | | | | | | BOFS | FINAL DEPTH | |
| ON | 01 | .2640 | 3 | .300 | .015 | .0000 | .063 | .005 |

*FIG. 13A*

SHOWS THE INCREMENTAL HOLE DEPTH PER PECK FROM THE TOP OF THE STACK

| PECK DEPTH | 1 | 2 | 3 | 4 | 5 | 6 | 7 | 8 |
|---|---|---|---|---|---|---|---|---|
| 1 | −.089 | | | | | | | |
| 2 | −.045 | −.089 | | | | | | |
| 3 | −.030 | −.059 | −.089 | | | | | |
| 4 | −.022 | −.045 | −.067 | −.089 | | | | |
| 5 | −.018 | −.036 | −.053 | −.071 | −.089 | | | |
| 6 | −.015 | −.030 | −.045 | −.059 | −.074 | −.089 | | |
| 7 | −.013 | −.025 | −.038 | −.051 | −.064 | −.076 | −.089 | |
| 8 | −.011 | −.022 | −.033 | −.045 | −.056 | −.067 | −.078 | −.089 |

PECK DRILLING SETUP PAGE

| PECKING STATUS | PECK TOOLS | STACK HEIGHT | NO. OF PECKS | UPPER LIMIT | 2nd UP LIMIT | LOWER LIMIT BOFS | | MINIMUM STROKE |
|---|---|---|---|---|---|---|---|---|
| ON | 01 | .7140 | 8 | .800 | -.025 | FINAL DEPTH | .103 .375 | .010 |
| | | | | | | .478 | | |

FIG. 14B

SHOWS THE INCREMENTAL HOLE DEPTH PER PECK FROM THE TOP OF THE STACK

| PECK DEPTH | 1 | 2 | 3 | 4 | 5 | 6 | 7 | 8 |
|---|---|---|---|---|---|---|---|---|
| 1 | -.257 | | | | | | | |
| 2 | -.129 | -.257 | | | | | | |
| 3 | -.086 | -.171 | -.257 | | | | | |
| 4 | -.064 | -.129 | -.193 | -.257 | | | | |
| 5 | -.051 | -.103 | -.154 | -.206 | -.257 | | | |
| 6 | -.043 | -.086 | -.129 | -.171 | -.214 | -.257 | | |
| 7 | -.037 | -.073 | -.110 | -.147 | -.184 | -.220 | -.257 | |
| 8 | -.032 | -.064 | -.096 | -.129 | -.161 | -.193 | -.225 | -.257 |

INCREMENTAL STEP DRILLING SYSTEM AND METHOD

CROSS REFERENCE TO RELATED APPLICATION

The present application claims priority and benefit under 35 U.S.C. §119(e) of U.S. Provisional Patent Application Ser. No. 60/260,508 filed Jan. 9, 2001, the entire contents of which are expressly incorporated herein.

FIELD OF THE INVENTION

The present invention relates generally to the field of printed circuit board drilling machines, and in particular to a method of improving incremental drilling.

DISCUSSION OF RELATED ART AND SUMMARY OF THE INVENTION

In the manufacture of printed circuit boards, frequently literally thousands of small holes must be drilled into each printed circuit board. In volume production of the circuit boards, the drilling of holes is accomplished by computer controlled automatic drilling machines in which the printed circuit boards are usually mounted on a work table which is movable in a horizontal X-Y plane.

Often, the holes of the printed circuit board are drilled mechanically using a small diameter drill bit. Usually, the work table moves horizontally to be positioned such that a spindle having the drill bit mounted therein may drill holes at appropriate drilling locations. Drilling of the circuit boards is accomplished by advancing each drill spindle downward through a vertical drilling stroke.

Typically, incremental drilling is used when drilling particularly deep holes in, for example, multiple layered circuit boards. During incremental drilling, the hole is drilled in predetermined increments. Usually, the increments are based upon the material being drilled, the diameter of the drill bit, the drilling rotational speed, the drilling axial speed and/or other relevant parameters. After each increment is drilled, the drill bit is withdraw entirely from the hole to allow the hole and drill bit to cool. Withdrawal also facilitates debris removal. The drill bit is then reinserted into the hole and another increment is drilled. The drill bit is again entirely withdrawn from the hole and the process continues until the hole reaches the desired depth.

A vital concern in the field of printed circuit board drilling machines is the speed with which a machine can drill holes. This is usually referred to as the productivity, or throughput, of a drilling machine. Although the time it takes to drill any single hole is relatively small, each circuit board drilled usually requires drilling thousands of holes, for example, as many as 20,000 or more holes per board. Consequently, any small variance in the time to drill a single hole has a greatly multiplied effect and is very significant in the long term.

Therefore, any method and/or apparatus for increasing the overall throughput of the hole drilling process can be of tremendous value.

One aspect of the present invention is a method for manufacturing a printed circuit board drilling machine. The drilling machine has a worktable, a spindle, a drill bit and a controller. The controller is configured to control the operation of the drilling machine. The drilling machine is configured to drill to a point in a work piece and to retract said drill bit a retract distance. The retract distance is configured such that a tip end of said drill bit remains below a top surface of said work piece. The drilling machine is also configured to drill a distance greater than said retract distance into said work piece.

Another aspect of the present invention is a printed circuit board drilling machine comprising a worktable, a spindle, a drill bit and a controller. The controller is configured to instruct the drilling machine to drill to a point in a work piece and to retract said drill bit a retract distance. The retract distance is configured such that a tip end of said drill bit remains below a top surface of said work piece. The controller also is configure to drill a distance greater than said retract distance into said work piece.

Yet another aspect of the present invention is a method for operating a printed circuit board drilling machine having a worktable, a spindle, a drill bit and a controller configured to control the operation of the drilling machine. The method comprises drilling to a point in a work piece and retracting said drill bit a retract distance. The retract distance is configured such that a tip end of said drill bit remains below a top surface of said work piece. The method further comprises drilling a distance greater than said retract distance into said work piece.

Further aspects, features and advantages of the invention will become apparent from the detailed description of the preferred embodiment which follows.

BRIEF DESCRIPTION OF THE DRAWINGS

These and other features of this invention will now be described with reference to the drawings of a preferred embodiment, which is intended to illustrate and not to limit the invention. The drawings contain the following figures:

FIGS. 2A, 2B, 2C, 2D, 2E, 2F, 2G, and 2H are schematic illustrations of a method of incremental drilling having certain features and advantages according to the present invention.

FIG. 8 is a partially cross-sectioned elevational view of a single spindle of the multi-spindle printed circuit board drilling machine of FIG. 4 with the spindle in a raised position;

FIG. 9 is a partially cross-sectioned elevational view of a single spindle of the multi-spindle printed circuit board drilling machine of FIG. 4 with the spindle in a lowered position;

FIGS. 13A and 13B illustrate set up screens for receiving pecking parameters.

FIGS. 14A and 14B illustrate display screens for displaying increments.

DETAILED DESCRIPTION OF THE PREFERRED EMBODIMENT

Figure 1A:
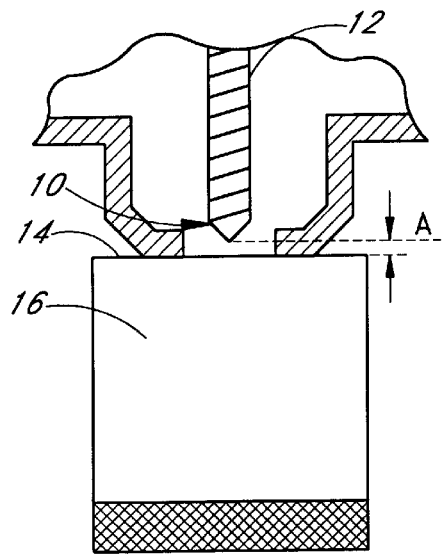
FIGS. 1A, 1B, 1C, 1D, 1E, 1F, 1G, and 1H are schematic illustrations of a standard prior art method of incremental drilling.
Figure 1B:
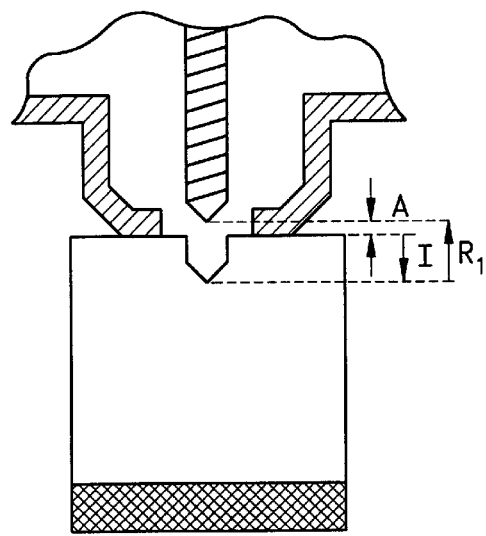

FIGS. 1A–H illustrate a standard prior art method for incrementally drilling holes in a printed circuit board. This method will be referred to as "standard incremental drilling" As shown in FIG. 1A, in the standard incremental drilling, a tip 10 of a drill bit 12 is initially located at a retract position, which is a distance A above a top surface 14 a work stack 16. In this example, a hole through the work stack 16 will be drilled in six equal increments I. For the hole to extend through the stack 16, the sum of six increments (i.e., 6I) must be greater than the depth of the work stack 16. More/less increments or smaller/larger increments can be used depending on the depth of the work stack 16, the material composition of the work stack 16, the diameter of the drill bit 12, the drilling rotational speed, the drilling axial speed and/or other relevant parameters. Of course, the method described below can also be used to create blind vias (i.e., holes that do not extend completely through the work stack 16).

During the first step (FIG. 1B), the drill bit 12 forms a first increment by drilling one increment I into the work stack 16. The drill bit 12 then retracts to the retract position. During the retract step, the drill bit travels a retract distance $R_1$ that is equal to the sum of the first increment I and the distance A.

Figure 1C:
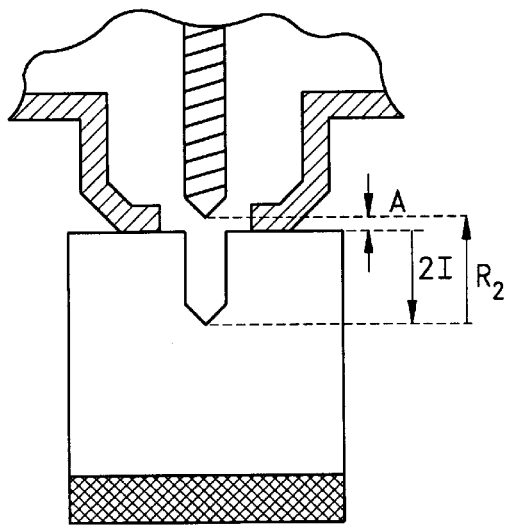
Figure 1D:
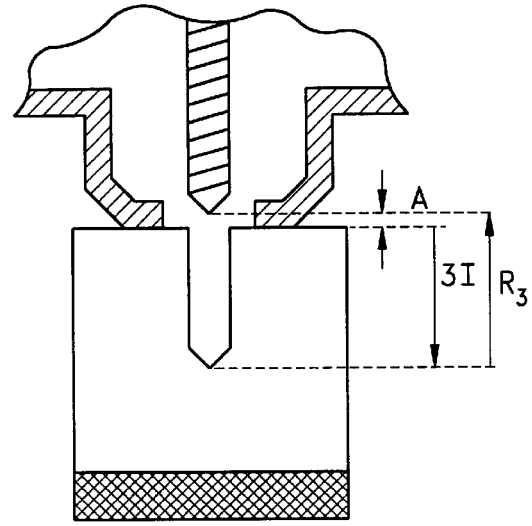

With reference to FIG. 1C, during the second step, the drill bit 12 forms a second increment by drilling to one increment below the first increment (i.e., to a depth equal to 2 increments). The drill bit 12 returns to the staring position by retracting a distance $R_2$, which is equal to the sum of two increments 2I and the distance A. During the third step (FIG. 1D), the drill bit 12 drills to one increment below the second increment and retracts a distance $R_3$ (i.e., 3I+A).

Figure 1E:
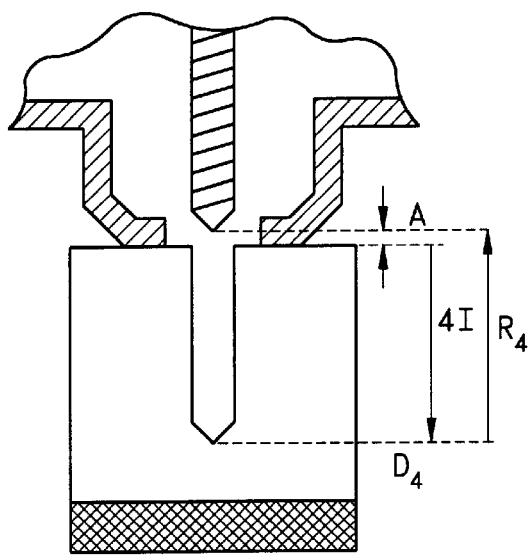
Figure 1F:
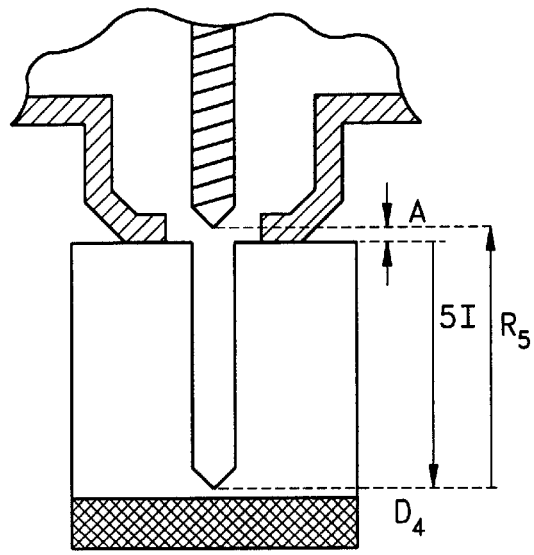
Figure 1G:
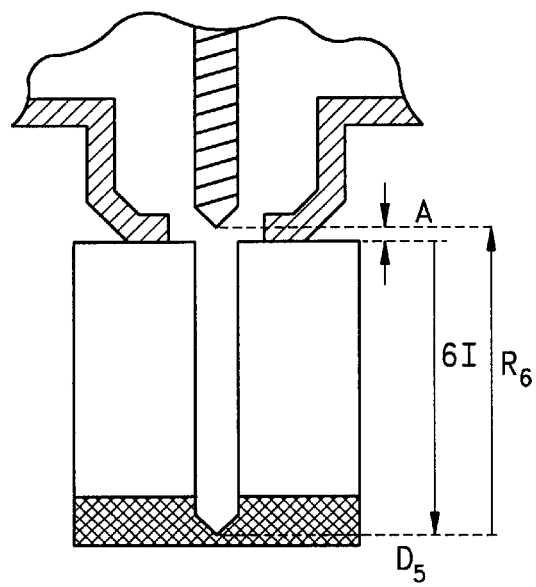
Figure 1H:
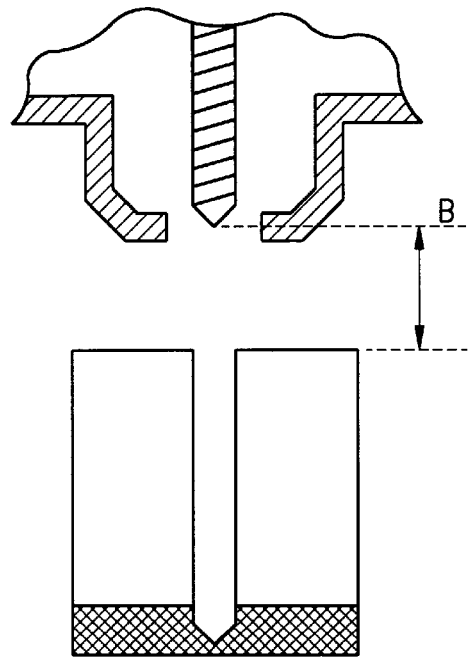

FIG. 1E illustrates the fourth increment. In this step, the drill bit 12 drills to one increment below the third increment and retracts a distance $R_4$ (i.e., 4I+A). FIG. 1F illustrates the fifth increment wherein the dill bit 12 drills one increment below the fourth increment and is retracted a distance $R_5$ (i.e., 5I+A). Finally, for the sixth increment, the dill bit 12 proceeds though the bottom of the work stack 16 by drilling six increments 6I into the work stack 16 (FIG. 1G). The drill bit 12 then retracts a distance $R_6$ (i.e., 6I+A). The drill bit is then moved to a starting position (see FIG. 1H), which is located above the retract position, a distance B above the top surface 14 of the work stack 16. This completes the standard incremental drilling cycle and the drill bit 12 can be moved to another location on the work stack 16 and another hole can be incrementally drilled.

Figures 2E, 2F:
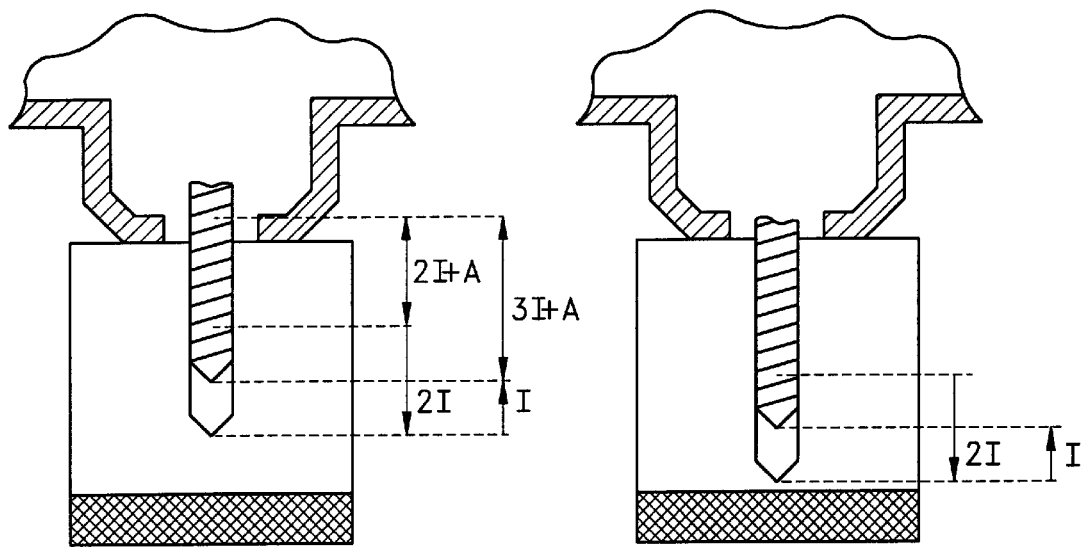

FIGS. 2A–G are schematic illustrations of the improved incremental drilling method, which has certain features and advantages according to the preferred embodiment. As shown in FIG. 2A, the tip 10 of the drill bit 12 is initially located at an initial retract position, which is a distance A above the top surface 14 of the work stack 16. During the first step (FIG. 2B), the drill bit 12 forms a first increment by drilling one increment I into the work stack 16. The drill bit 12 retracts back to the initial retract position by traveling a retract distance $R_1$, which is preferably equal to the sum of the first increment I and the distance A.

As described above, in the illustrated arrangement, the drill bit 12 returns to the initial retract position at the end of the first step. However, it should be appreciated that in modified arrangements, the drill bit 12 can be retracted to a position located below the initial retract position. For example, the first retract distance R1 can be configured such that the tip 10 of the drill bit lies at or below the top surface 14 of the work stack. When the drill bit is retracted to a position below the initial retract position A, the drill bit 12 has to travel a smaller distance as compared to the standard incremental drilling method and the preferred embodiment described herein.

With reference to FIG. 2C, the drill bit 12 forms a second increment by drilling one increment past the first increment. It will be appreciated that the drill bit 12 travels downward a distance equal to two increments 2I plus the distance A. Moreover, although the drill bit 12 is spinning and, therefore, "drilling" substantially the entire time the drill bit is moving downward, the drill bit 12 only removes material from the work stack 12 during the last increment of distance, which in the preferred embodiment is equal in distance to I.

After drilling one increment past the first increment, the drill bit 12 retracts to an intermediate retract position, which preferably lies below the top surface 14 of the work stack. In the preferred embodiment, the intermediate retract position is the depth of the previous step. That is, at the end of the second step, the tip 10 of the drill bit is located at approximately one increment below the top surface 14 of the work stack 16. In other words, in the preferred embodiment, in the second step, the drill bit 12 moves downward through an initial stoke that is slightly greater than two increments 2I (i.e., 2I plus A) and retracts a stroke of one increment I.

Figures 2G, 2H:
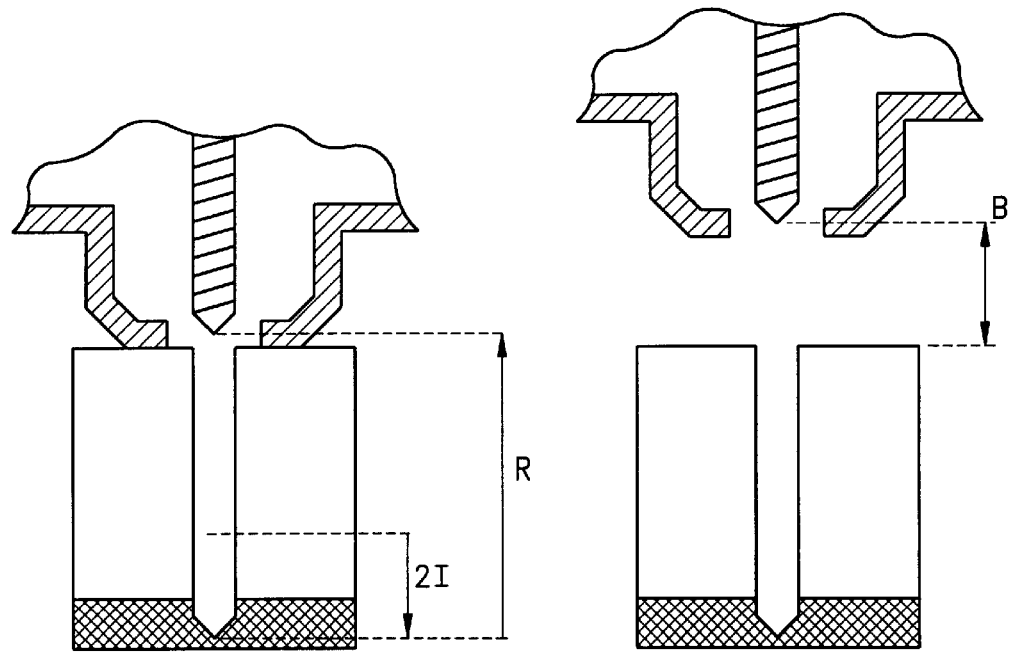

During the third step (FIG. 2D), the drill bit 12 drills two increments 2I into the work stack 16, thereby reaching a depth that is equal to three increments 3I. The drill bit 12 is then retracted one increment to the intermediate retract position, which in the preferred arrangement is the depth of the previous increment (i.e., 2I). FIG. 2E illustrates the fourth step. As with the previous step, the drill bit 12 drills two increments 2I into the work stack 16 and is retracted one increment I. FIG. 1F illustrates the fifth step in which the drill bit 12 drills two increments 2I into the work stack 16 and is retracted one increment I. Finally, in the sixth step, the drill bit 12 drill two increments thereby penetrating the bottom of the work stack 16 (see FIG. 2G). The drill bit 12 is then retracted to the initial retract position, which is a distance A above the retract position. As shown in FIG. 2H, the drill bit 12 is then moved to a starting position, which is a distance B above the top surface 14 of the work stack 16. This completes a cycle of the improved incremental drilling method. The drill bit 12 can now be moved to another location on the work stack 16 and another hole can be incrementally drilled.

During the improved incremental drilling method, the drill bit 12 travels significantly less than in the standard incremental drilling method. For example, during the down strokes between the second increment and the last increment, the preferred embodiment of the improved incremental drilling method saves a distance, which is equal to the following equation:

$$DS=(N-2)*I+A$$

where
DS=distance saved
N=increment number
I=increment length
A=initial retract height Thus, for example, for the fourth increment (FIG. 2F), the improved incremental drilling method saves a distance equal to the sum of 2I+A during the downward stroke.

Excluding the last increment, the preferred embodiment of the improved incremental drilling methods saves a distance, which is equal to the following equation:

$$DS=(N-1)*I+A$$

where
DS=distance saved
N=increment number
I=increment length
A=initial retract height Thus, for example, during third increment (FIG. 2F), the improved incremental drilling method saves a distance equal to 3I+A during the retract stroke.

Figure 3:
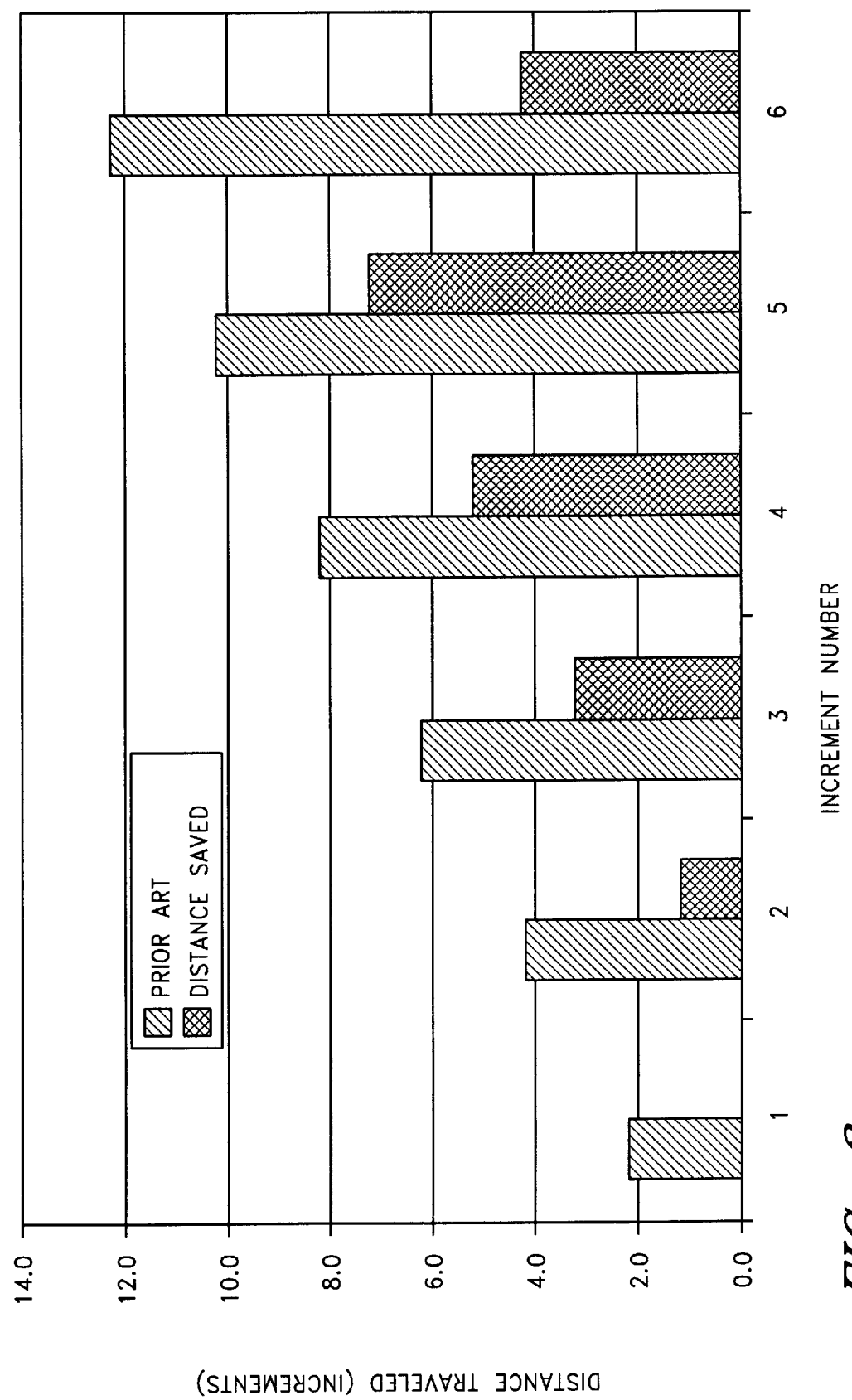
FIG. 3 is a graph comparing the distance traveled in the z direction in the prior art and according to a preferred embodiment.

FIG. 3 is a graph that illustrates the potential distance saved using the preferred embodiment of the improved incremental drilling method. In this figure, the vertical axis indicates the distanced traveled in terms of increments. One set of columns represents the distance traveled using the standard incremental drilling method described and illustrated in FIGS. 1A–H. The other set of columns represents the distanced saved using the preferred embodiment of the incremental drilling method described above and illustrated in FIGS. 1A–H.

Figure 4:
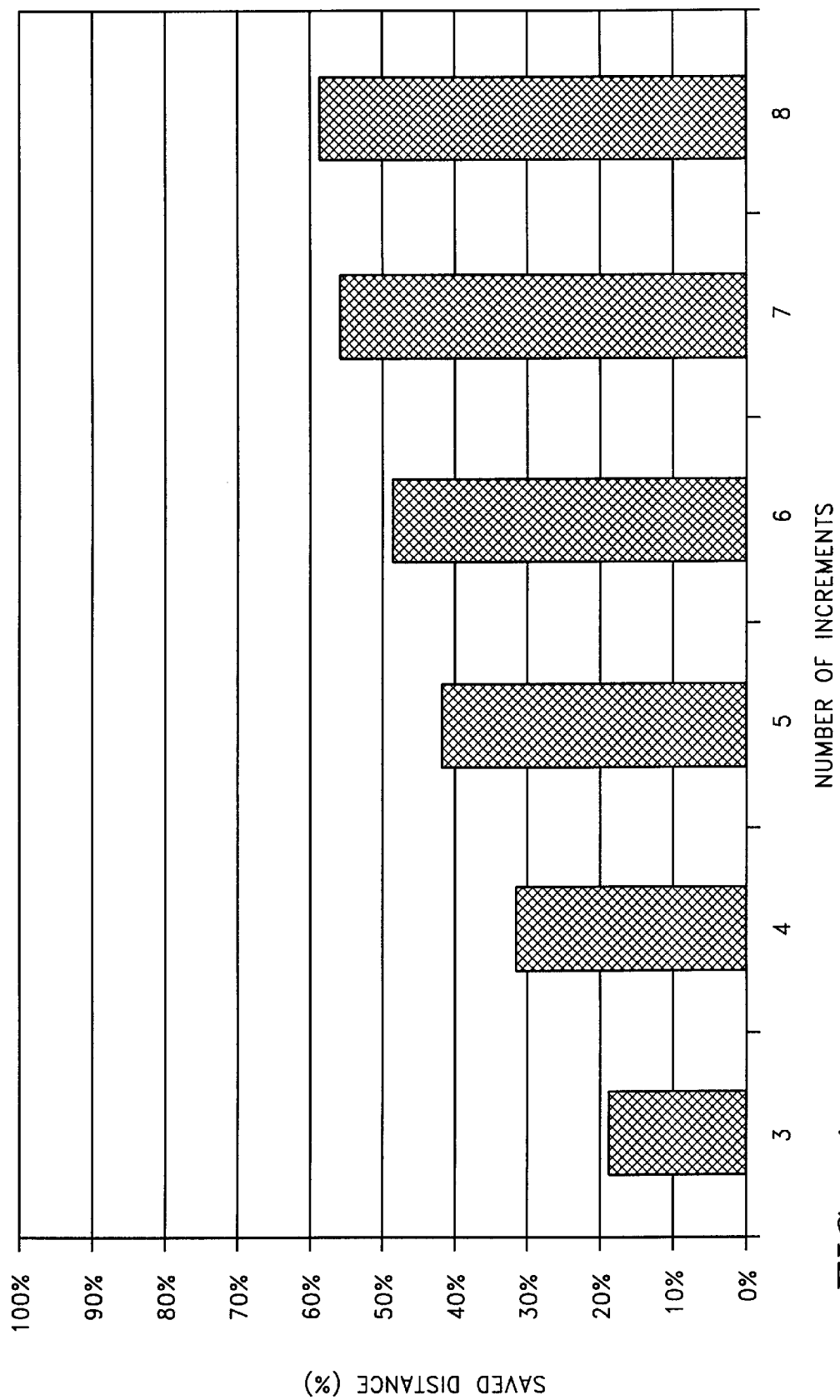
FIG. 4 is another graph comparing the distance traveled in the z-direction in the prior art and according to a preferred embodiment.

FIG. 4 is another graph that illustrates the potential distance saved using the preferred embodiment of the improved incremental drilling method. In FIG. 4, the columns represent the saved distance as a function of the number of increments used to drill through the work stack 16. The saved distance is indicated as a percentage of the distanced traveled during the standard incremental drilling method described above. As shown, a substantial amount of distance is saved by using the improved incremental drilling method.

Because of the distance saved, the improved incremental drilling method requires less time to drill through the work stack as compared to the standard incremental drilling method. As mentioned above, the time it takes to drill any single hole is relatively small. However, each circuit board drilled usually requires drilling thousands of holes per board (e.g., as many as 20,000). Consequently, the time saved using the improved incremental drilling method when multiplied can greatly increase the through put of a drilling machine.

Figure 5A:
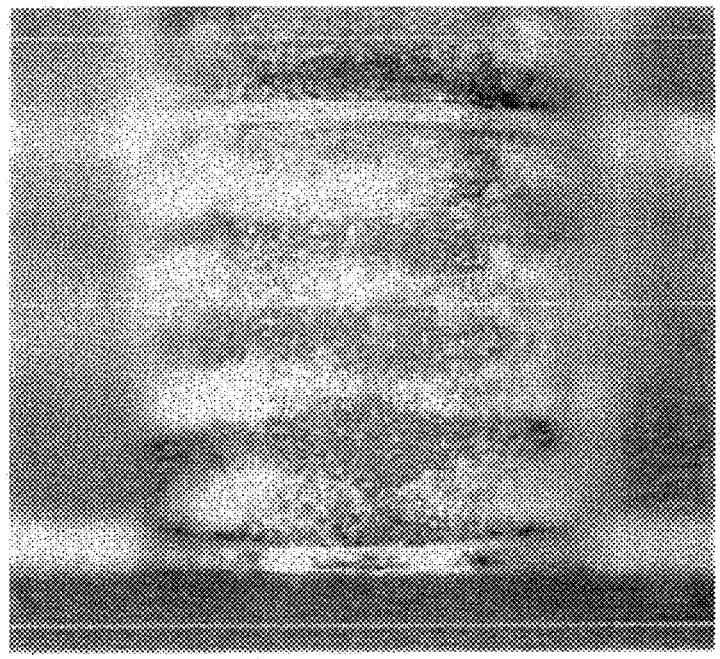
FIGS. 5A and 5B illustrate wall smear incurred during the standard prior art method of incremental drilling and incremental drilling according to the preferred embodiment.
Figure 5B:
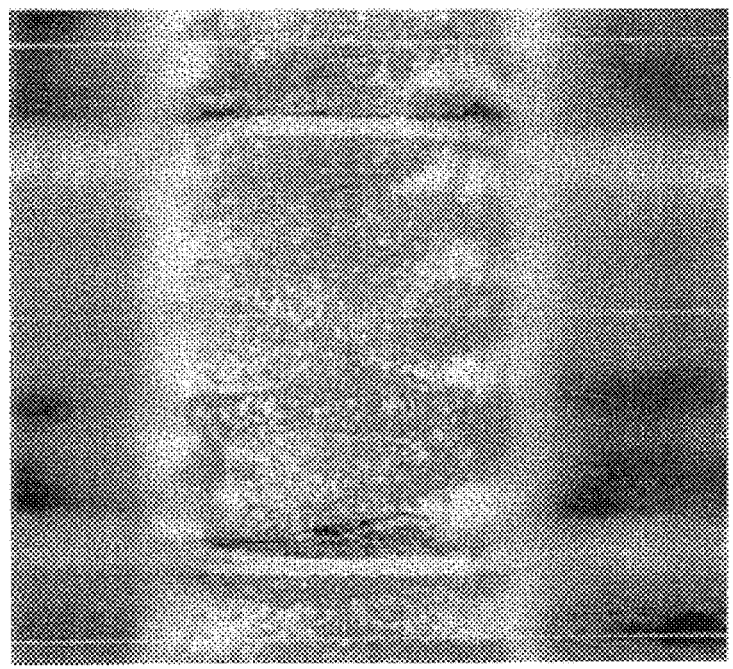

FIG. 5A and 5B illustrate the wall smear incurred using the standard incremental drilling method (FIG. 5A) and the improved incremental drilling method (FIG. 5B). Wall smear is caused by the contact between the drill bit relief, the wall of the hole and any debris in the hole. As shown in the figures, the improved incremental drilling method produces only marginal differences in the degree of wall smear as compared to the standard incremental drilling method. In general, the improved incremental drilling method produces slightly more wall smear throughout the hole. Both methods have been determined to provide adequate debris removal, which occurs during the retract portions of the respective incremental drilling methods.

Figure 6A:
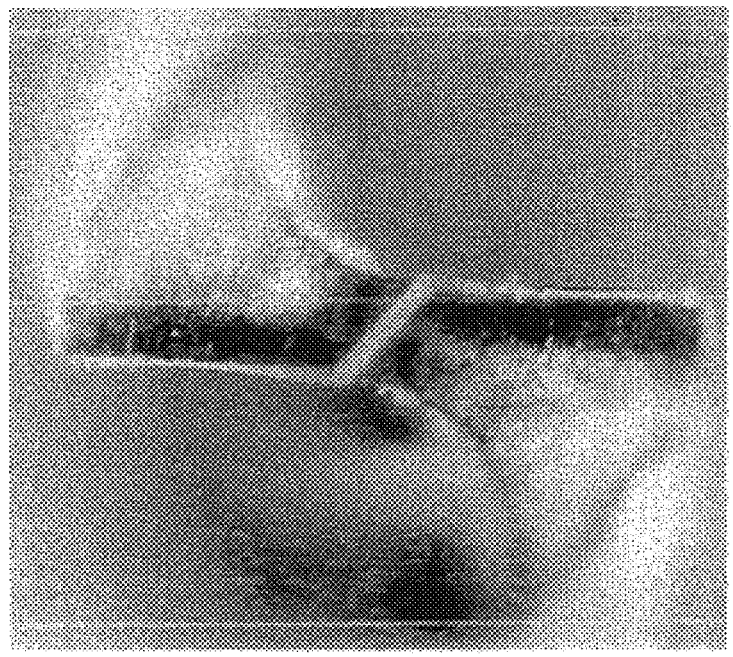
FIGS. 6A and 6B show the drill bit tip wear during the standard prior art method of incremental drilling and incremental drilling according to the preferred embodiment after 500 hits on a 0.390 inch think multi-layered panel.
Figure 6B:
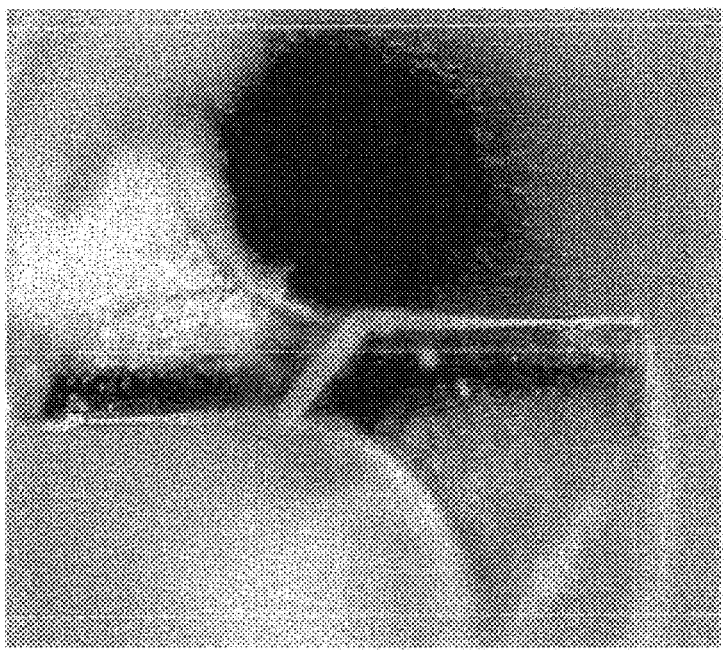

FIG. 6A and 6B show the drill bit tip during the standard peck method (FIG. 6A) and the quick peck method (FIG. 6B) after 500 hits on a 0.390 inch think multi-layered panel. As indicated by these figures, the wear on the cutting edge of the drill tip is fairly similar for the two incremental drilling methods.

In the preferred embodiment of the improved incremental drilling method described above, the increments I were of uniform size. However, it should be appreciated that several features and advantages of the preferred embodiment can be achieved in a modified embodiment wherein the increments are non-uniform. Such non-uniform increments can be particularly useful when drilling through a work stack that has non-uniform properties. For example, if the work stack becomes harder or more dense as the drill bit travels through the work stack, it may be desirable to decrease the length of the increments as the drill bit moves through the work stack.

Excluding the first and last steps, the preferred embodiment of the improved incremental drilling method described above employed a retract distance that was equal to one increment. That is, during the retract stroke the drill bit 12 was returned to the depth of the previous increment. However, several features and advantages of the preferred embodiment can also be achieved in a modified embodiment, wherein the retract distance is smaller or longer than one increment. For example, the retract distance can be 1.5 times longer than one increment with the drilling distance being adjusted accordingly.

In yet another modified embodiment, a "full" retract can be integrated into the improved incremental drilling method. That is, the improved incremental drilling method can be "interrupted" by withdrawing the drill bit completely out of the work stack. After the drill bit is completely withdrawn, the drill bit can be reinserted into the hole and the improved incremental drilling method peck can be resumed. Such a modified embodiment may be useful if the drill bit and/or the work stack would otherwise become too hot.

FIGS. 7–10 illustrate a multi-spindle printed circuit board drilling machine 100 having certain features and advantages. In particular, as will be described in detail below, the drilling machine 100 is configured to incrementally drill according to the improved incremental drilling method describe above.

Figure 7:
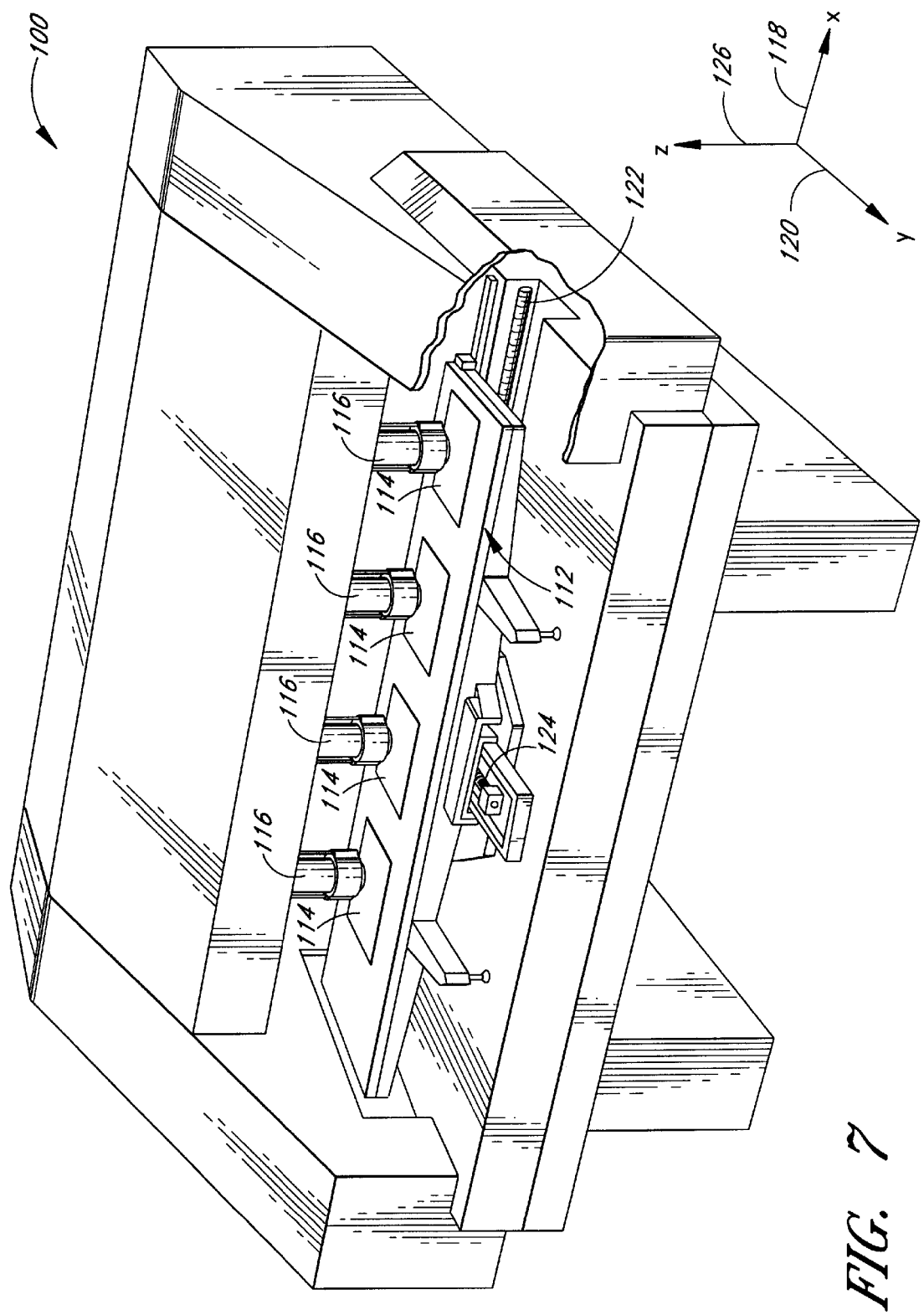
FIG. 7 is a perspective view of a of a multi-spindle printed circuit board drilling machine having certain features and advantages according to the preferred embodiment.
Figure 10:
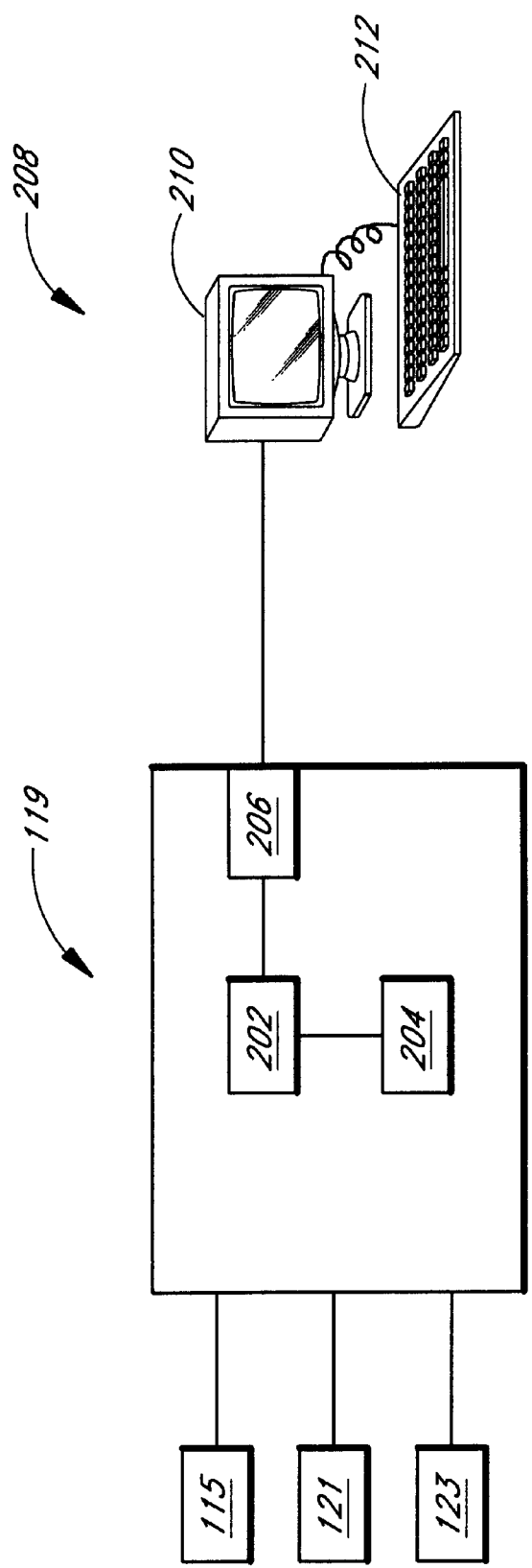
FIG. 10 is a schematic illustration of a controller used to control the multi-spindle printed circuit board drilling machine of FIG. 4.

With initial reference to FIG. 7, the drilling machine includes a work table 112 on which work pieces 114, such as printed circuit boards, are mounted. Above the work table 112, one or more spindles 116 are mounted on a carriage (not shown). The work table 112 preferably is movable in a horizontal plane defined by an X-axis 118 and a Y-axis 120. Preferably, the work table 112 is movable parallel to either axis 118, 120. In the illustrated arrangement, the work table 112 is displaced by a first motor (see FIG. 10) 115 that rotates lead screws 122 and 124, which are parallel to the X and Y axes, respectively. In turn, the first motor 115 preferably is controlled by a controller 119, which is shown in FIG. 8 and will be described in detail below. As is known in the art, positioning of the work table 112 relative to the spindle 116 on a drilling machine can be achieved by alternate arrangements, such as moving by the spindle 116 in one direction along the X-Y plane and moving the work table 112 in the other direction, for example.

Each spindle 116 defines an axis A (FIG. 8) and is movable in a direction perpendicular to the work table 112, from a raised position to a lowered position. Typically, the axis A is parallel to a Z-axis 126. The spindles 116 are displaced by a second motor 121 (shown schematically in FIG. 10), which drives a lead screw arrangement of a type well known by those skilled in the art. As will be described in detail below, the second motor 121 and thus the movement of the spindle 116 along the Z-axis preferably is controlled by the controller 119.

With reference now to FIGS. 8 and 9, a drill bit 128 is mounted in the spindle 116 so that the drill 128 depends from the bottom of the spindle 116. A collet 130 on the spindle 116 grips a cylindrical shank 132 of the drill 128. The spindle 116 is driven by a second motor 123 (see FIG. 10), which preferably is also controlled by the controller 119, to cause rotation of the drill 128 to effect drilling. A pressure foot 134 is mounted beneath the spindle 116, and is movable relative to the spindle 116 in a vertical direction. In the illustrated arrangement, the pressure foot 134 is joined to the spindle 116 by cylindrical rods 136, which are pneumatically biased, so that the pressure foot 134 is forced downwardly, away from the spindle 116. A bottom surface 138 of the pressure foot 134 engages the top of the work piece 114 during drilling operations, as shown in FIG. 9. During drilling, the spindle 116 is driven downwardly so that the pressure foot bottom surface 138 engages the work piece 114. The downward force of the spindle 116 easily overcomes the biasing force on the rods 136, so that the spindle 116 continues to move vertically downwardly, and also begins to move downwardly relative to the pressure foot 134. Continued downward movement of the spindle 116 causes the drill tool 128 to pass through an aperture 140 in the pressure foot 134, as illustrated in FIG. 9.

The illustrated drill bit 128 may be of a variety of diameters D. Preferably, the diameter of the drill bit 128 is in the range between 0.002 and 0.260 inches. As illustrated in FIGS. 8 and 9, a stack of four to five work pieces 114 commonly make up a work stack. Additionally, a piece of back-up material 142 may be positioned between the stack of work pieces 114 and the work table 112 to prevent damage to the upper surface of the work table 12.

In operation, the spindles 116 are originally in a raised position starting position, as illustrated in FIG. 8. The work table 112 is positioned in a plane defined by the X-axis 118 and the Y-axis 120 by lead screws 122, 124 such that an axis A of the drill bit 128 intersects a desired hole location. The desired hole location is a circular area defined by the projection of the desired drill hole on an outer surface of the work piece 114.

The drill spindles 116 are then lowered until the bottom surface 138 of the pressure foot 134 contacts the stack of work pieces 114 (i.e., the initial retract position). The pressure foot 134 holds the stack of work pieces 114 in place with the axis A of the spindle 16. The spindles 116 continue in a downward stroke overcoming the resistance from the biased pressure foot 134. Upon reaching the bottom of its stroke, or the lowered position, the spindle 116 begins to move upwardly and returns to its initial raised starting position. The work table 112 is then moved to a subsequent position in the X-Y plane by lead screws 122, 124, such that the axis A of the spindle intersects a center point of a subsequent desired hole location and a new drilling cycle begins. Preferably, the controller 125 (FIG. 10) controls these movements. The process is continued until the desired number of holes are drilled into the stack of printed circuit boards, or work pieces 114.

As mentioned above, the movement of the drill spindle 116, the rotation of the drill spindle 116 and the movement of the work table 112 preferably are controlled by the controller 119, which is illustrated schematically in FIG. 8.

The controller 119 preferably comprises a CPU (central processing unit) 202, a memory 204 and an input/output device 206 for receiving instructions and/or displaying information to a user on a input/output interface 208. In the illustrated embodiment, the input/output interface 208 comprises a display screen 210 and a keyboard 212; however, in modified embodiments, the input/output interface 208 could include, for example, a touch screen arrangement.

The controller 119 is operatively connected to the first, second and third motors 115, 121, 123 so as to control the movement of the drill spindle 116, the rotation of the drill spindle 116 and the movement of the work table 112. Of course, in modified embodiments, more than one controller can be used and/or the more or less motors can be used.

With reference now to FIGS. 11A–D, an exemplary routine 300 for executing the preferred embodiment of the improved incremental drilling method is illustrated. The routine 300 preferably begins by receiving pecking parameters from the user (S-1). Such pecking parameters preferably are entered into the memory 204 of the controller 119 via the input/output interface 208. The pecking parameters preferably include the following parameters: "starting position", "stack height", "initial retract position", "hole depth" "number of pecks", and "minimum stroke".

Figure 12:
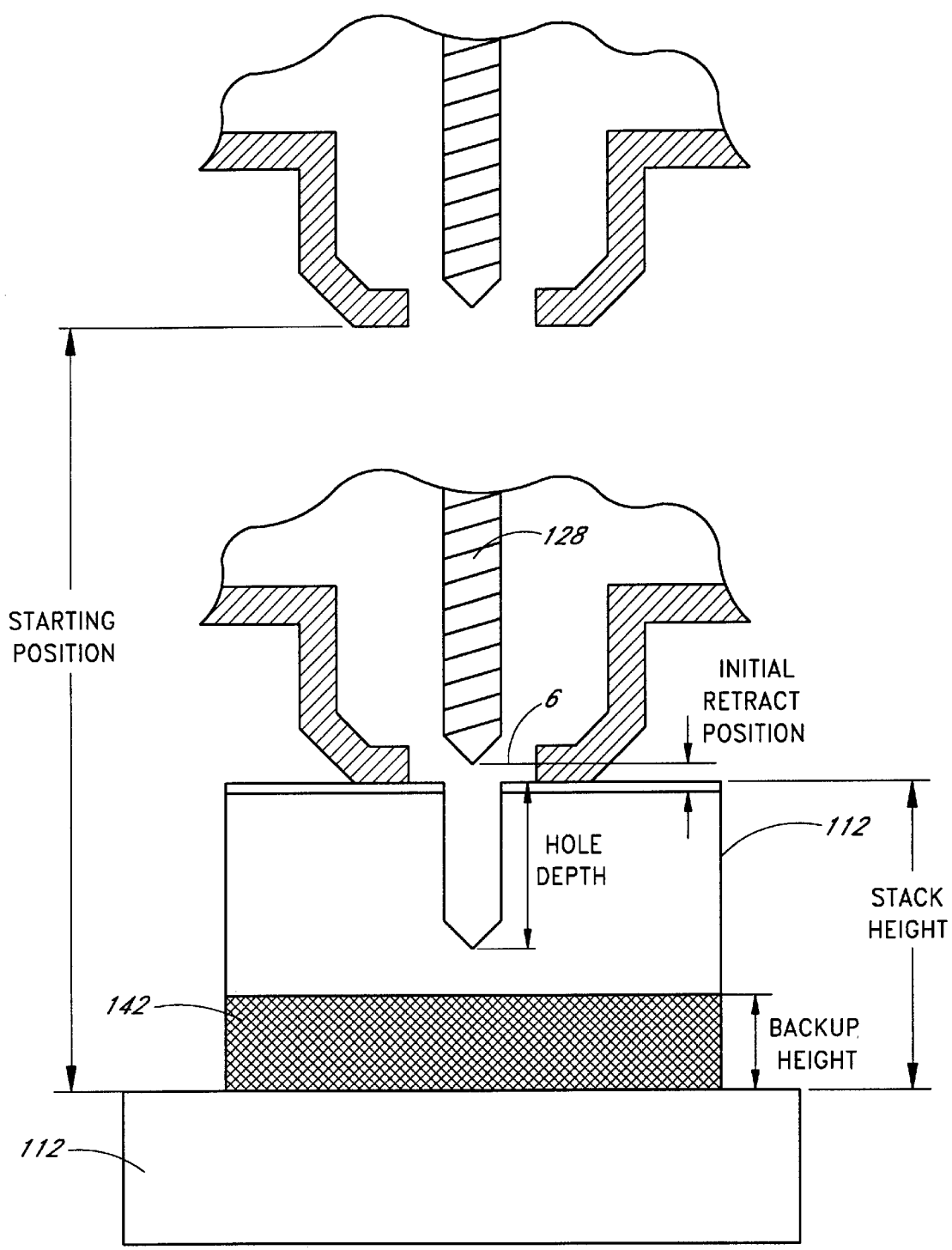
FIG. 12 is a schematic partially cross-sectioned elevational view of a single spindle.

With reference to FIG. 12, the starting position is the height of the drill 128 above the work table 112 after drilling a hole and before moving to the position of the next hole. For example, the starting height in FIG. 2H is the distance B. Stack height is the height of the work stack 114 and is preferably defined from top surface of the work table 112. The stack height is used by the controller 119 to determine when the drill 128 will contact the work stack 114. The initial retract position is the height of the drill above the work stack 114 before the first increment is drilled. As explained above, during the standard incremental drilling method described above, this is the position that the drill returns after drilling each increment (i.e., the distance A). During the preferred embodiment of the improved incremental drilling method, this is the position that the drill returns to after drilling the first increment. For drilling blind vias, the hole depth is used to define the desired depth of the holes to be drilled (see FIG. 12). The number of pecks is the number of increments that are to be drilled per each hole. Preferably, the operator selects this number based upon the material to be used and other factors. More preferably, the controller is configured to calculate the length of each increment by dividing the hole depth by the number of pecks.

As mentioned above, in the preferred embodiment, the increments are uniform. However, in modified embodiments, the increments can be non-uniform. For example, if the density of the work stack increases with depth, the increments can become progressively smaller. The minimum stroke defines a minimum increment length that can be used during the improved incremental drilling method. Preferably, the memory 204 stores a default value of approximately 0.005 inches; however, the user may select any suitable length. The controller 119 preferably includes an alarm to warn the operator of such a situation. Using increments smaller than the minium increment may produce excess heat, which will reduce hole quality.

The pecking parameters described are particularly useful for drilling blind vias (i.e., holes that do not penetrate the top the work stack 114). For drilling through the work piece, the pecking parameters preferably also include the following parameters: "backup height" and "offset". Backup height is the height of the backup material 142 as measured from the work table 112. The offset is the desired depth of the hole with reference to the backup material 142. A positive value indicates the hole lies above the backup material 142 and a negative value indicates that the hole extends into the backup material 142. The final depth of the hole is the stack height minus the offset. In this arrangement, the controller 119 can calculate the length of the increments can by dividing he final depth by the pecking number. As with the blind vias, if the increments are smaller than the minimum stroke the operator preferably is warned.

Of course those of skill in the art will recognize that the information contained in the performance parameters may also be defined in other modified ways while still achieving certain features and advantages of the preferred embodiment. For example, the pecking parameters could include an "increment depth", which defines the depth of each increment. In such an arrangement, the hole depth can be defined by multiplying the increment depth by the number of pecks. In another arrangement, the pecking parameters can include a "retract limit", which is the distance the retract stroke. Preferably, this distance is less than or equal to the length of an increment. Of course, the pecking parameters can also be provided with different names.

FIGS. 13A and 13B are illustrations of exemplary setup screens 302a, 302b, which can be displayed on the input/output interface 208. The setup screens 302 prompt the operator to input various pecking parameters into the controller 119. For example as shown in FIG. 13A, the illustrated setup screen 302a preferably includes "Pecking Status" button 304a, which can be used to switch the drilling machine 100 from a non-incremental drilling mode to an incremental drilling mode. The illustrated "Pecking Status" button 304a also indicates the current mode of the drilling machine 100. A "Pecking Tools" 306a button can be used to select a set of pecking parameters from the memory 204. That is, a set of pecking parameters can be stored in the memory 204 and associated with a variable that is displayed in the Pecking Tools button 306a. In this manner, the operator can recall a set of pecking parameters by choosing a specific variable with the Pecking Tools button 306a.

With a "Stack Height" button 310a, the stack height, which was described above, can be inputted into the controller 119. A "No. of Pecks" button 312a can be used to input the desired number of increments to be drilled per each hole. A "Upper Limit" button 314a can be used to input the starting position, which was described above. Similarly, a "2nd Up Limit" button 316a can be used to input the initial retract position, which was also described above.

In the preferred embodiment, a "Lower Limit" button 218a and a "BOFS" button 320a are not used in creating blind vias. As such, these buttons will be described below with respect to FIG. 13B. A "Final Depth" button 322a and a "Minimum Stroke" button 324a can be used to input the final depth and minimum stroke, which were described above.

FIG. 13B illustrates a setup screen 302b for creating through holes (i.e., holes that extend through the work stack 114). As with FIG. 13A, this setup screen 302b includes a "Pecking Status" button 304b, "Pecking Tools" 306b a "Stack Height" button 310b, a "No. of Pecks" button 312b, an "Upper Limit" a "2nd Up Limit" button 316b, a "Lower Limit" button 218b, a "BOFS" button 320a, "Final Depth" button 322b and a "Minimum Stroke" button 324b. In this arrangement, The "Lower Limit" button 218b preferably is automatically set to the height of the backup material (see FIG. 12). The "BOFS" button 320b is used to adjust the backup height relative to the height of the mapped surface.

The "Final Depth" button 322b, in this arrangement, displays the sum of the data entered into with the "Lower Limit" button 218b and the "Backup Offset" button 322b.

Figure 11A:
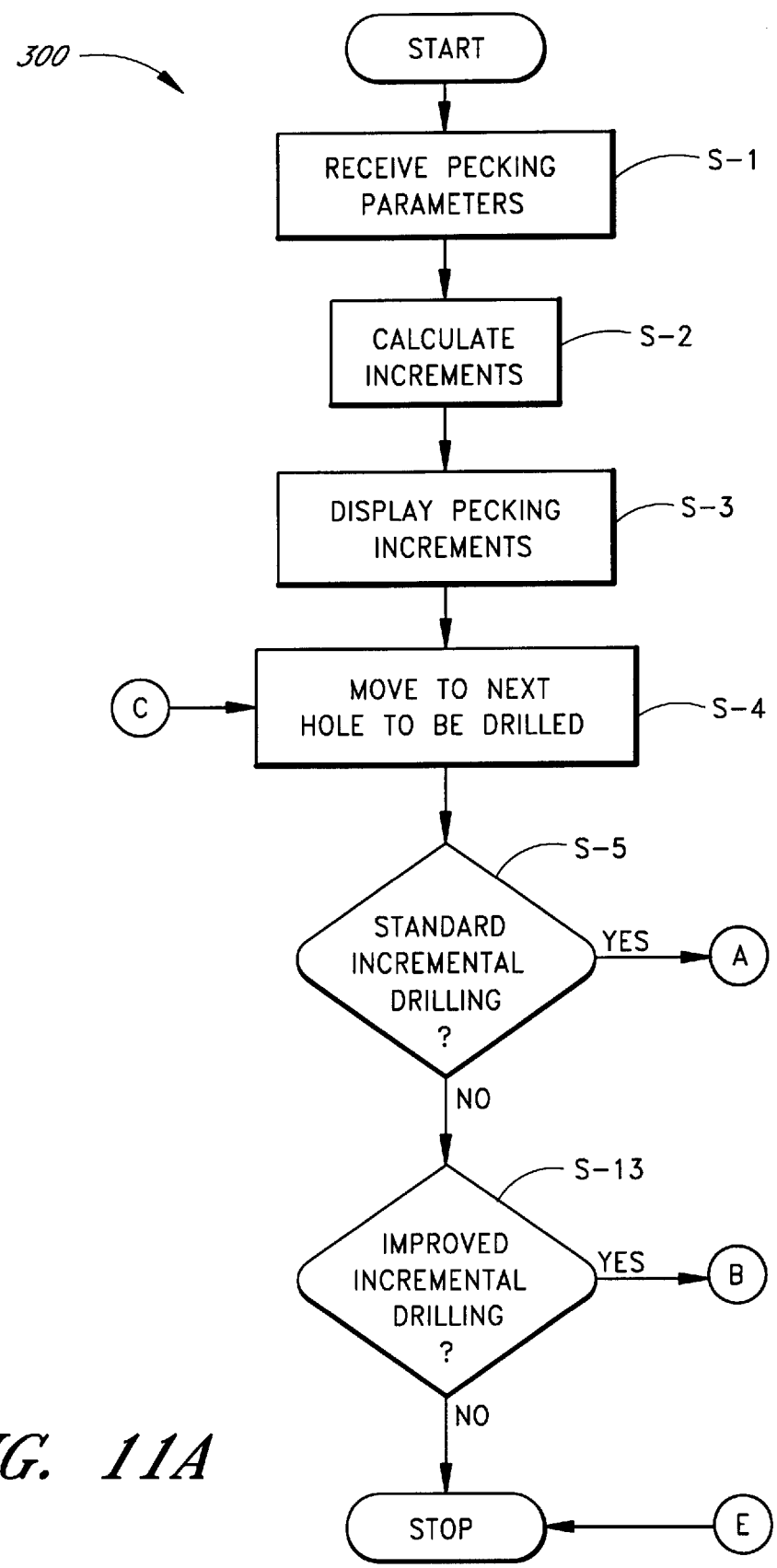
FIGS. 11A, 11B, 11C, and 11D illustrate exemplary routine that can be used to employ certain features, aspects and advantages of the preferred embodiment.

With reference to FIG. 11A, after the routine 300 receives the Pecking Parameters, the routine calculates the pecking increments as described above (S-2). In a preferred arrangement, the routine 300 then displays the pecking depth per increment on the display 210 (S-3) in a tabular format as shown in FIGS. 14A and 14B. In modified arrangements, the pecking depth per increment can be shown in a graphical format.

After displaying the pecking depth per increment, the routine moves the work table 112 (if necessary) such that the drill 132 is centered over the location of the next hole to be drilled (S-4). The routine 300 then determines if the operator has chosen standard incremental drilling (S-5).

Figure 11B:
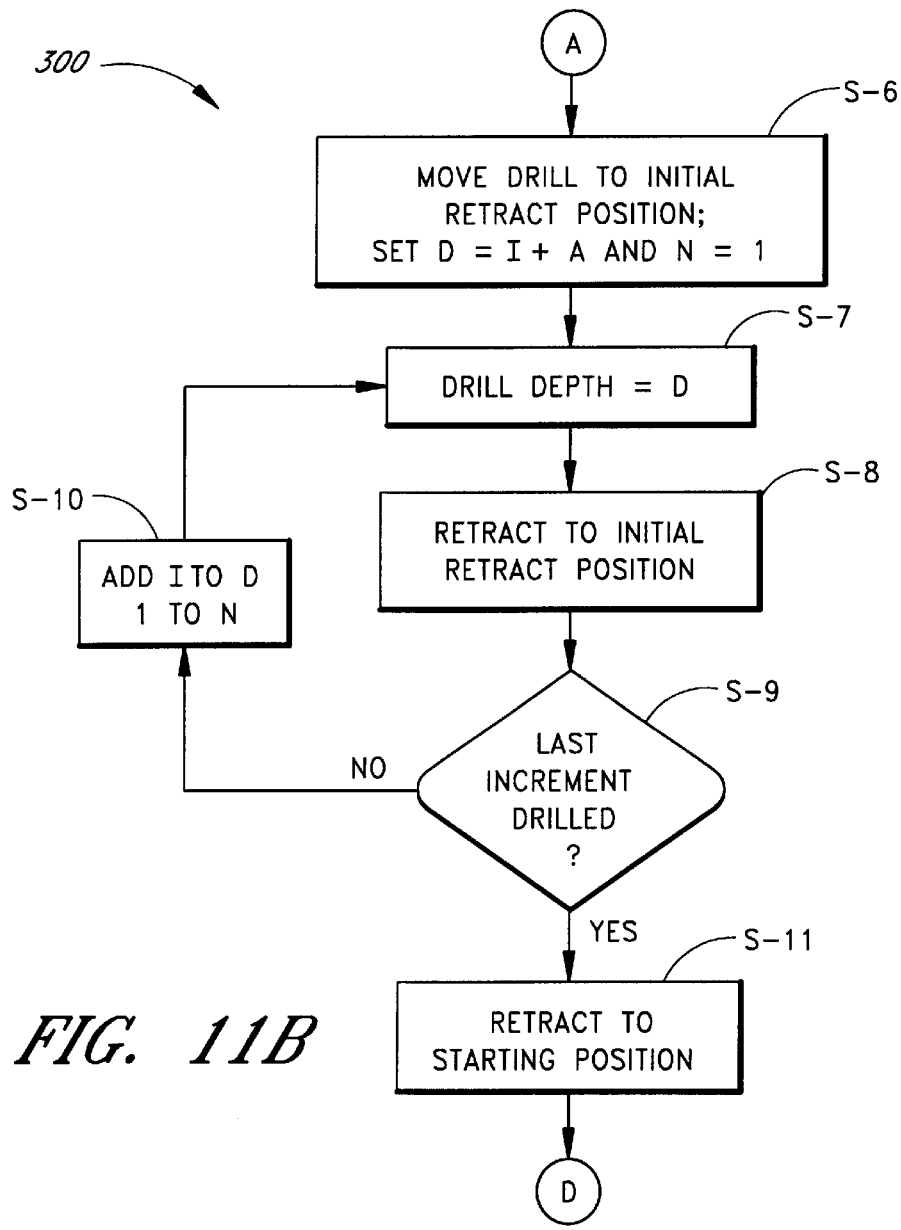

As shown in FIG. 11B, if standard incremental drilling has been chosen, the routine 300 moves the drill 128 to the initial retract position (S-6). The routine 300 also (i) sets a depth variable D to the sum of one increment I and the initial retract height A and (i) an increment counter N to one. The routine 300 then has the drill 128 drill to a depth equal to the depth variable D (S-7). The routine 300 then retracts the drill to the initial retract position (S-8).

The routine 300 then determines if the last the increment has been drilled (S-9). Preferably, this involves comparing the increment counter N to the number of pecks chosen by the operator. If the last increment has not been drilled, the routine 300 adds an increment I to the depth variable D and adds one to the increment counter N (S-10). The routine 300 then loops back to drill a depth equal the depth variable (S-7). Steps S-7 through S-10 are repeated until the last step is drilled.

Figure 11C:
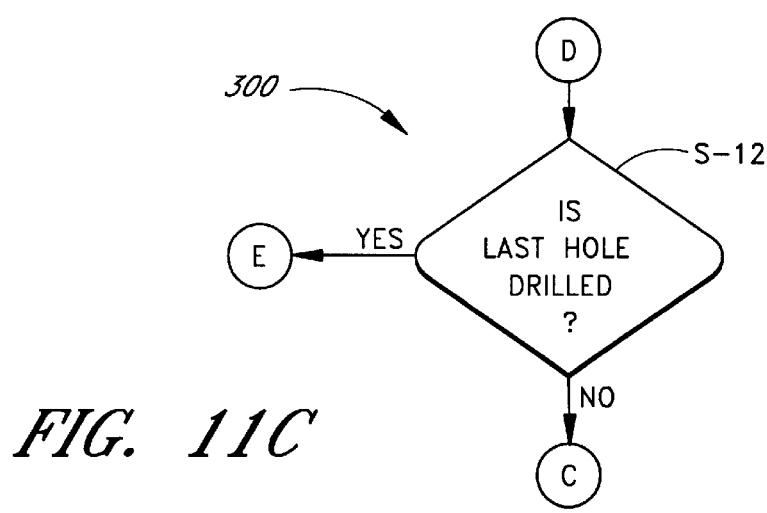
Figure 11D:
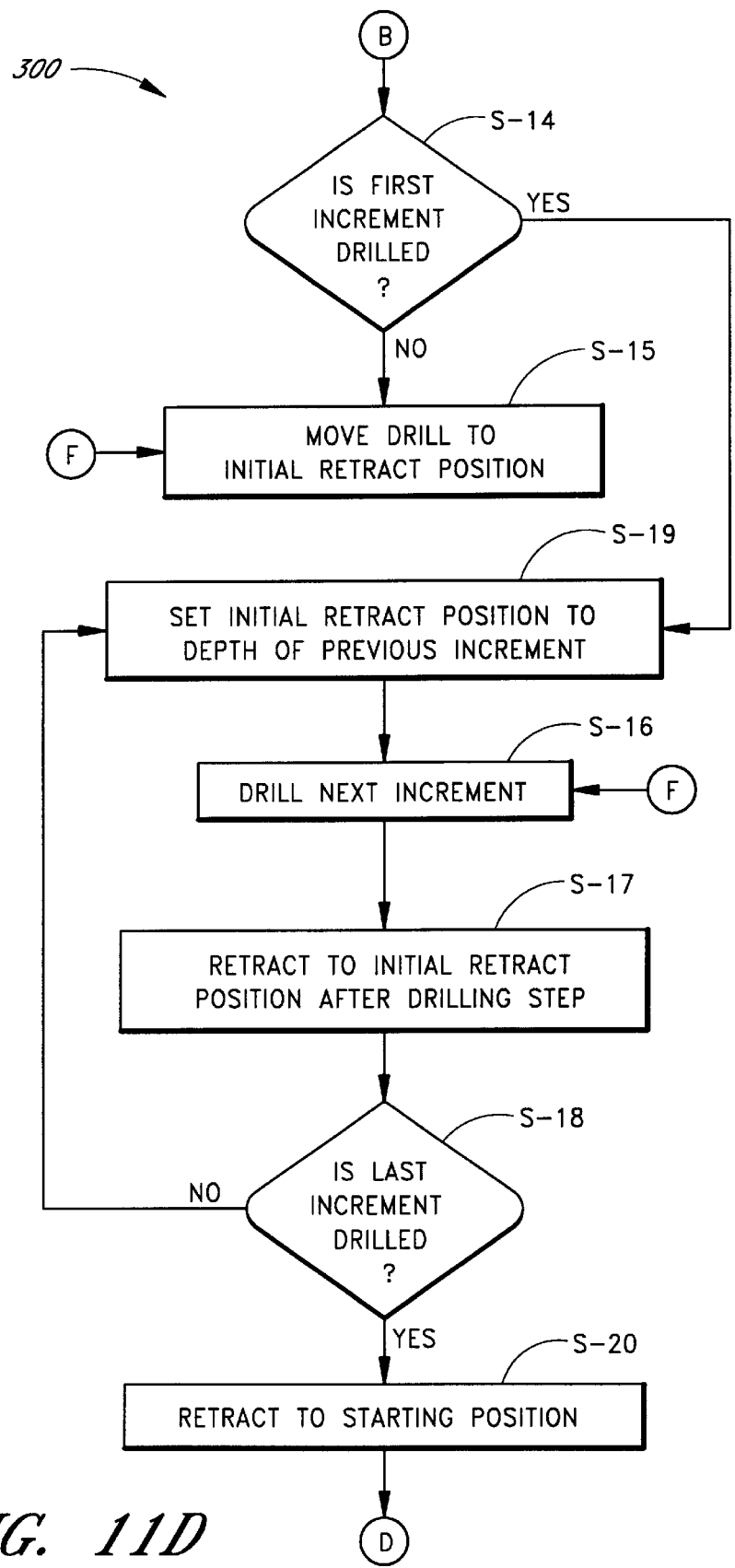

When the last step is drilled, the routine 300 instructs the drill to be retracted to the starting position (S-11). As shown in FIG. 11C, the routine 300 then determines if the last hole has been drilled (S-12). If the last hole has not been drilled, the routine 300 loops back to operational block S-4 and moves the work table 142 such that the drill 128 is centered over the location of next hole to be drilled. If the last hole has been drilled, the routine 300 is stopped.

With reference back to decisional block S-5 of FIG. 11A, if standard incremental drilling has not been selected, the routine 300 then determines whether the improved incremental drilling method has been selected (S-13). If the improved method has not been selected, the routine 300 is stopped. If the improved method has been selected the routine 300 moves to decisional block S-14 (see FIG. 11D). At decisional block S-14, the routine determines if the first increment has been drilled, preferably, by determining if the increment counter N is equal to one. If the first step has not been drilled, the routine 300 moves the drill to the initial retract position (S-15). The routine 300 then drills the next increment into work piece (S-16). For the first increment, the distance drilled preferably equals sum of the distance A (i.e., the distance the initial retract position lies above the work stack 114) and the increment I. For subsequent steps, the distance drilled preferably equals the sum of two increments (i.e., 2I).

After the increment has been drilled, the routine 300 retracts the drill to the initial retract position (S-17). The routine 300 then determines if the last increment has been drilled (S-18) preferably this is done by determining if the increment counter N is equal to the pecking number. If the last increment has not been drilled, the routine moves to operational block S-19. At operational block S-19, the routine 300 adds one to the increment counter and the initial retract position is set to the height of the previous increment's depth.

Steps S-16 through S-19 are repeated until the last increment is drilled. When the last step is drilled, the routine 300 retracts the drill to the starting position (S-20). As shown in FIG. 11C, the routine 300 then determines if the last hole has been drilled (S-12). If the last hole has not been drilled, the routine 300 loops back to operational block S-4. If the last hole has been drilled, the routine 300 is stopped.

Figure 15:
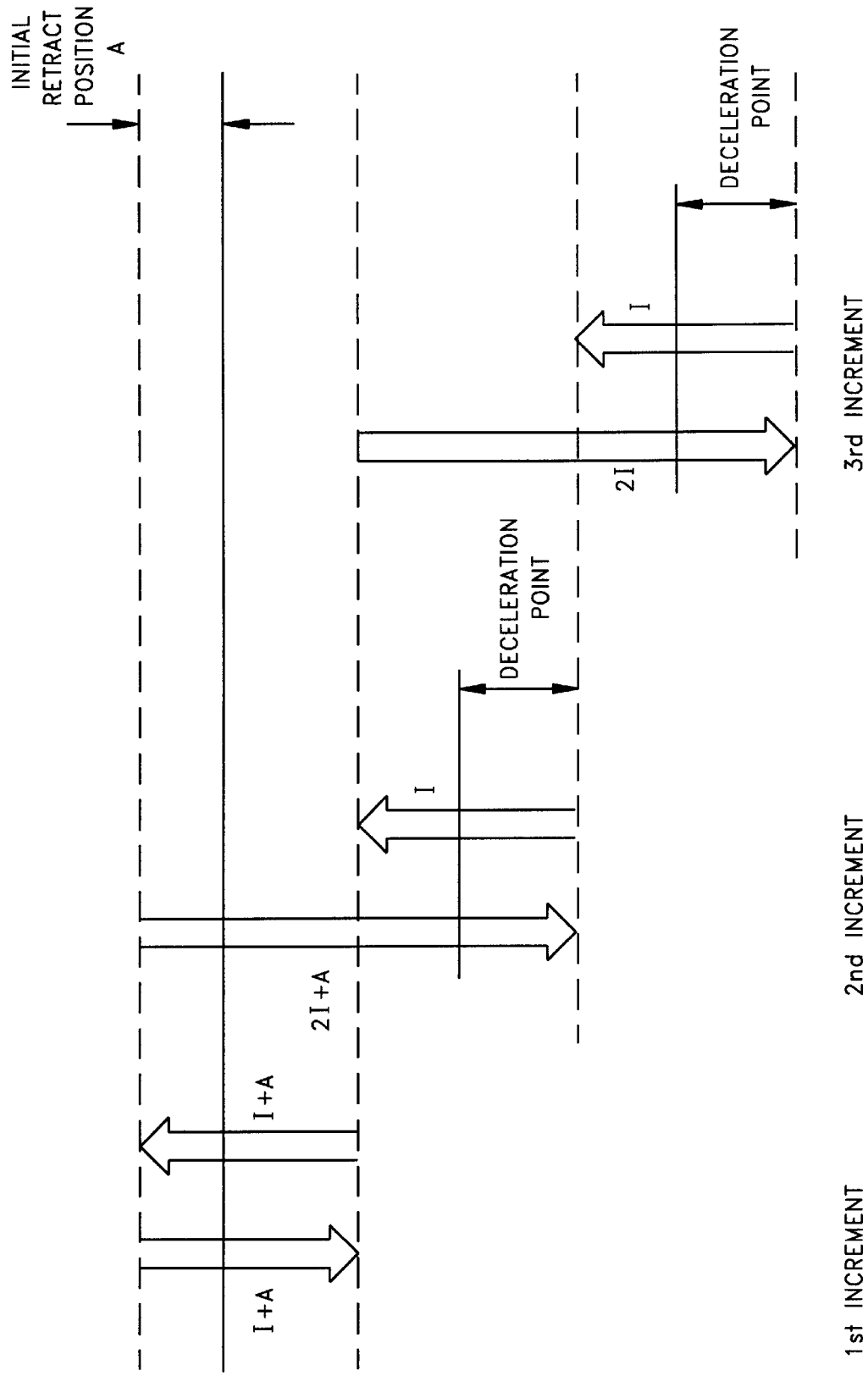
FIG. 15 schematically illustrates a modified embodiment of an improved incremental drilling method.

FIG. 15 illustrates modified arrangement of the improved incremental drilling method. In this method, the operator can set a "deceleration point". During a downward stroke, the axial speed of the drill 128 is reduced at the deceleration point. Preferably, the axial speed is reduced to a drilling axial speed, which is particularly suited for removing the material. Typically, the drilling axial speed is related to the material being drilled, the diameter of the drill bit, the drilling rotational speed and/or other relevant parameters. In a similar manner, the axial speed of the drill 128 preferably increased at the deceleration point during the retract stroke.

The controller 119 preferably is configured such that the operator can set the deceleration point. In the preferred arrangement, the deceleration point is defined as distance above depth of the previous increment. Preferably, this distance is less than the distance of a single increment. The controller 119 preferably is also configured such that the operator can set the axial speed above the deceleration point. Preferably, this axial speed ranges from about 1 inches per minute to 250 inches per minute. If the operator sets the axial speed beyond this range, the controller 119 preferably sets the axial speed to a default value (e.g., 250 inches per minute).

It should also be appreciated that the arrangement described above can be integrated into the standard incremental drilling method described above. In such an arrangement, the drill is fully retracted after drilling each increment. However, the axial speed of the drill can be reduced at the deceleration point as described above.

This invention has been disclosed in the context of certain preferred embodiments and examples, it will be understood by those skilled in the art that the present invention extends beyond the specifically disclosed embodiments to other alternative embodiments and/or uses of the invention and obvious modifications and equivalents thereof. In addition, while a number of variations of the invention have been shown and described in detail, other modifications, which are within the scope of this invention, will be readily apparent to those of skill in the art based upon this disclosure. It is also contemplated that various combination or subcombinations of the specific features and aspects of the embodiments may be made and still fall within the scope of the invention. Accordingly, it should be understood that various features and aspects of the disclosed embodiments can be combine with or substituted for one another in order to form varying modes of the disclosed invention. Thus, it is intended that the scope of the present invention herein disclosed should not be limited by the particular disclosed embodiments described above, but should be determined only by a fair reading of the claims that follow.

We claim:

1. A printed circuit board drilling machine in combination with a printed circuit board, the drilling machine having a worktable for supporting the printed circuit board, a spindle, a drill bit and a controller configured to instruct the drilling machine to drill to a point in the printed circuit board, to retract said drill bit a retract distance, said retract distance configured such that a tip end of said drill bit remains below a top surface of said printed circuit board and to drill a distance greater than said retract distance into said printed circuit board.

2. The drilling machine of claim 1, wherein said controller is further configured to retract said drill bit a retract distance and to drill to a distance greater than said retract distance until a final depth is reached.

3. The drilling machine of claim 2, wherein said controller is further configured to completely withdraw said drill tip from said printed circuit board after said final depth is reached.

4. The drilling machine of claim 1, wherein said controller is further configured to receive said retract distance from an operator.

5. The drilling machine of claim 1, wherein said controller is further configured to calculate said retract distance from a set of operational data that is inputted into said controller by an operator.

6. The drilling machine of claim 1, wherein said controller is further configured to receive data indicating a stack height and a number of increments from an operator and to calculate the retract distance from said stack height and said number of increments.

7. The drilling machine of claim 1, wherein said controller is further configured to receive data indicating a hole depth and a number of increments from an operator and to calculate the retract height from said hole depth and said number of increments.

8. The drilling machine of claim 1, wherein said controller is further configured to drill to a first depth in said printed circuit board and to completely withdraw said drill bit from said printed circuit board.

9. The drilling machine of claim 1, wherein said controller is further configured to retract said drill bit a retract distance and to drill to a distance greater than said retract distance until a final depth is reached and said retract distance is uniform.

10. The drilling machine of claim 1, wherein said controller is further configured to retract said drill bit a retract distance and to drill to a distance greater than said retract distance until a final depth is reached and said retract distance is non-uniform.

11. The drilling machine of claim 1, wherein said controller is further configured to retract said drill bit a retract distance and to drill to a distance greater than said retract distance until a final depth is reached and said distance greater than said retract distance is uniform.

12. The drilling machine of claim 1, wherein said controller is further configured to retract said drill bit a retract distance and to drill to a distance greater than said retract distance until a final depth is reached and said distance greater than said retract distance is non-uniform.

13. The drilling machine of claim 1, wherein said controller is further configured to retract said drill bit a retract distance and to drill to a distance greater than said retract distance until a final depth is reached and said retract distance is uniform and said distance greater than said retract distance is uniform.

14. The drilling machine of claim 1, wherein said controller is further configured such that to reduce an axial speed of the drill bit, while drilling a distance greater than said retract distance, from a first axial speed to a second axial speed when the drill bit when the drill bit passes a deceleration point.

15. The drilling machine of claim 14, wherein said controller is further configured to receive the deceleration point and the first axial speed from an operator.

16. The drilling machine of claim 15, wherein said controller is further configured to, while said drill bit is being retracted, reduce from a first axial speed to a second axial speed when the drill bit passes a deceleration point.

17. The drilling machine of claim 16, wherein said controller is further configured to receive the deceleration point and the first axial speed from an operator.

18. A method for operating a printed circuit board drilling machine having a worktable, a spindle, a drill bit and a controller configured to control the operation of the drilling machine, the method comprising the steps of:
positioning a printed circuit board on the worktable;
drilling to a point in the printed circuit board;
retracting said drill bit a retract distance, said retract distance configured such that a tip end of said drill bit remains below a top surface of said printed circuit board,
drilling a distance greater than said retract distance into said printed circuit board.

19. The method of claim 18, further including repeatedly retracting said drill bit a retract distance and drilling a distance greater than said retract distance until a final depth is reached.

20. The method of claim 19, further including completely withdrawing said drill tip from said printed circuit board after said final depth is reached.

21. The method of claim 18, further including receiving said retract distance from an operator.

22. The method of claim 18, further including calculating said retract distance from a set of operational data that is inputted into said controller by an operator.

23. The method of claim 18, further including receiving data indicating a stack height and a number of increments from an operator and configuring and calculating the retract height from said stack height and said number of increments.

24. The method of claim 18, further including receiving data indicating a hole depth and a number of increments from an operator and calculating the retract height from said hole depth and said number of increments.

25. The method of claim 18, further comprising drilling to a first depth in said printed circuit board and completely withdrawing said drill bit from said printed circuit board.

26. The method of claim 18, further including retracting said drill bit a retract distance and drilling to a distance greater than said retract distance until a final depth is reached, wherein said retract distance is uniform.

27. The method of claim 18, further including retracting said drill bit a retract distance and drilling to a distance greater than said retract distance until a final depth is reached, wherein said retract distance is non-uniform.

28. The method of claim 18, further including retracting said drill bit a retract distance and drilling to a distance greater than said retract distance until a final depth is reached, wherein said distance greater than said retract distance is uniform.

29. The method of claim 18, further including retracting said drill bit a retract distance and drilling to a distance greater than said retract distance until a final depth is reached, wherein said distance greater than said retract distance is non-uniform.

30. The method of claim 18, further including retracting said drill bit a retract distance and drilling to a distance greater than said retract distance until a final depth is reached, wherein said retract distance is uniform and said distance greater than said retract distance is uniform.

31. The method of claim 18, further comprising, while drilling a distance greater than said retract distance, reducing an axial speed of the drill bit from a first axial speed to a second axial speed when the drill bit passes a deceleration point.

32. The method of claim 31, further comprising receiving the deceleration point and the first axial speed from an operator.

33. The method of claim 18, further comprising, while retracting said drill bit, reducing an axial speed of the drill bit from a first axial speed to a second axial speed when the drill bit passes a deceleration point.

34. The method of claim 33, further comprising receiving the deceleration point and the first axial speed from an operator.

35. A method for operating a printed circuit board drilling machine having a worktable for supporting a plurality of circuit boards, a plurality of spindles each associated with a drill bit, and a controller configured to control the operation of the drilling machine, the method comprising the steps of:
positioning the plurality of circuit boards on the work table such that each of the plurality of circuit boards is associated with a spindle and a drill bit;
drilling to a point within each of the plurality of printed circuit boards;
retracting said plurality of drill bits a retract distance, said retract distance configured such that a tip end of said plurality of drill bits remains below a top surface of each of said plurality of printed circuit boards,
drilling a distance greater than said retract distance into each of said plurality of printed circuit boards,
retracting said plurality of drill bits a second retract distance, said second retract distance configured such that a tip end of said plurality of drill bits remains below a top surface of each of said plurality of printed circuit boards,
drilling a distance greater than said second retract distance into each of said plurality of printed circuit boards
retracting said plurality of drill bits a third retract distance, said third retract distance configured such that a tip end of said plurality of drill bits remains below a top surface of each of said plurality of printed circuit boards, and
drilling a distance greater than said third retract distance into each of said plurality of printed circuit boards.

36. The method of claim 35, further comprising moving each spindle and drill bit with respect to their associated circuit board.

37. The method of claim 36, wherein moving each spindle and drill bit with respect to their associated circuit board comprises moving the work table.

* * * * *